United States Patent
Sakai et al.

[11] Patent Number: 5,958,843
[45] Date of Patent: Sep. 28, 1999

[54] OXYGEN ANNEALING PROCESS FOR BULK SUPERCONDUCTORS

[75] Inventors: Naomichi Sakai; Mikio Takahashi; Ken Nagashima; Masato Murakami, all of Tokyo, Japan

[73] Assignees: International Superconductivity Technology Center; Railway Technical Research Institute, both of Japan

[21] Appl. No.: 08/924,337

[22] Filed: Sep. 5, 1997

[30] Foreign Application Priority Data

Sep. 11, 1996 [JP] Japan .................................. 8-240181

[51] Int. Cl.$^6$ ................................................ H01L 39/00
[52] U.S. Cl. .......................... 505/500; 505/450; 505/451; 264/82; 264/154; 264/155
[58] Field of Search ...................... 505/450, 451, 505/470, 500; 264/82, 154, 155, 156; 427/62, 63

[56] References Cited

U.S. PATENT DOCUMENTS

| | | | |
|---|---|---|---|
| 4,960,752 | 10/1990 | Ashok et al. | 505/1 |
| 5,474,976 | 12/1995 | Kondoh et al. | 505/450 |
| 5,496,799 | 3/1996 | Yoshida et al. | 505/450 |

OTHER PUBLICATIONS

"Melt processing for obtaining $NdBa_2Cu_3 O_y$ superconductors with high $T_c$ and large $J_c$," S.I. Yoo et al, *Applied Phys. Lett.*,65(5), Aug. 1,1994, pp. 633–635.

"Processing of bulk YBaCuO," M. Murakami, *Supercond. Sci. Technol.*5 (1992), pp. 185–203.

*Primary Examiner*—Christopher A. Fiorilla
*Attorney, Agent, or Firm*—Austin R. Miller

[57] ABSTRACT

A bulk superconductor is produced by subjecting $REBa_2Cu_3O_y$ oxide to oxygen annealing after many holes have been formed in the oxide body.

10 Claims, 2 Drawing Sheets

FIG_1

OXYGEN ANNEALING PROCESS FOR BULK SUPERCONDUCTORS

BACKGROUND OF THE INVENTION

1. Field of the Invention

This invention relates to an oxygen annealing process for bulk superconductors, and more particularly to a process capable of quickly and sufficiently introducing oxygen into a bulk oxide by taking a newly-devised treatment in the introduction of oxygen into the bulk oxide.

The bulk superconductor intended in the invention is a $REBa_2Cu_3O_y$ bulk superconductor suitable for use in superconducting bearings, superconducting transport systems, superconducting magnets, magnetic shields and the like.

2. Description of Related Art

Recently, a large-size bulk superconductor is desired as a part of applications of a superconductor such as a flywheel, power application in a linear motor car, and the like.

For such bulk superconductor applications, a bulk oxide of $REBa_2Cu_3O_y$ system (123 type) is particularly considered to be useful.

Since the repulsive force between the superconductor and permanent magnet required in the above applications is proportional to the magnitudes of critical current density ($J_C$) and shielding current loop (R), it is required to make $J_C$ and R large in order to produce a bulk superconductor having higher performances.

It is necessary to eliminate factors resulting in weak links such as grain boundaries obstructing current flow, cracks and the like as far as possible for increasing $J_C$.

Further, it is necessary to make a large crystal for increasing R.

As a method of producing such a bulk superconductor, melt growth processes such as MPMG processes [M. Murakami, *Supercond. Sci. Technol.*, 5(1992), 185], OCMG process [S. I. Yoo et al., *Appl. Phys. Lett.*, 65(1994), 633] and the like are employed.

The melt growth process is a method wherein a superconducting precursor (green compact body or sintered body) is heated to a temperature above a melting point of 123 type superconducting phase and then recrystallized, whereby a large-size crystal without weak links can be obtained. However, it is required to change an oxygen partial pressure in the melt growth in accordance with the kind of rare earth element (RE) used. Because, in case of a 123 type material having a RE ionic radius larger than that of Gd, if a sample is prepared in an atmosphere having a higher oxygen partial pressure, Ba ion is substituted by RE ion to deteriorate the superconducting property.

The melt-grown superconductor is a mere semi-conductive material in the as-grown state in which the oxygen content y is about 6.1–6.4 as it is, so that the oxygen content is necessary to be raised to y=about 6.9 in order to provide a good superconducting property.

Therefore, it is intended to provide the superconducting property by subjecting the resulting bulk oxide to a heat treatment at temperatures of about 300–600° C. in an oxygen atmosphere for a long time, which is referred to as oxygen annealing.

According to the calculation of trapped magnetic field, the magnetic flux density becomes large as the size of the bulk body becomes large. In fact, however, oxygen required for the provision of the superconducting property is not introduced sufficiently into the inside of the large-size bulk body, so that a good superconducting property is not obtained as might have been expected.

That is, oxygen diffuses from the surface of the bulk body into the inside thereof in the above oxygen annealing, but as the size of the bulk body becomes large, it is difficult to uniformly introduce sufficient oxygen into the inside of the bulk body, so that the good superconducting property as expected is not obtained by only increasing the size of the bulk body.

From the measurement of the trapped magnetic field, it is readily confirmed that the surface of the bulk body is superconducting, but the inside thereof is only semiconducting.

SUMMARY OF THE INVENTION

It is, therefore, an object of the invention to advantageously solve the aforementioned problems and to provide an oxygen annealing process for bulk superconductors capable of quickly and sufficiently conducting the introduction of oxygen into a large-size bulk oxide to give a satisfactory superconducting property to such a large-size bulk oxide.

Moreover, large bulk superconductors frequently contain cavities or voids in the bulk body, which results in the deterioration of mechanical properties. Therefore, it is another object of the invention to provide an oxygen annealing process for bulk superconductors capable of effectively eliminating the deterioration of mechanical properties resulting from the cavities or voids.

The inventors have made various studies in order to solve the above problems and made the following discoveries:

(1) In order to sufficiently introduce oxygen into the inside of the bulk body in the oxygen annealing, it is advantageous to form many holes in the bulk body to increase a specific surface area thereof;

(2) Since oxygen diffuses through the Cu—O chain (parallel to the a-b plane) of a 123 type crystal, it is effective to orient these holes in a direction intersecting with the a-b plane of the 123 type crystal; and (3) Since silver passes oxygen, when silver is filled in the holes, oxygen can freely diffuse in the boundary between silver and bulk body, while silver penetrates through the holes and fills the cavities or voids in the bulk body, so that the mechanical properties of the bulk superconductor can effectively be improved without damaging the rapid superconducting formation.

According to the invention, there is the provision of a process for producing a superconductor by subjecting a melt-grown $REBa_2Cu_3O_y$ bulk oxide to oxygen annealing, in which holes are formed in the bulk oxide to increase the specific surface area thereof prior to the oxygen annealing.

In preferable embodiments of the invention, RE is at least one rare earth element selected from the group consisting of La, Nd, Sm, Eu, Gd, Dy, Ho, Y, Er and Yb, and the holes are formed in a direction intersecting with the a-b plane of the 123 type crystal, and the diameter of the hole is 0.01–2.0 mm, and the volume ratio of the holes occupied in the bulk oxide is 0.1–20%, and the oxygen annealing is carried out after silver is filled in the holes.

BRIEF DESCRIPTION OF THE DRAWINGS

The invention will be described with reference to the accompanying drawings, wherein.

DESCRIPTION OF PREFERRED EMBODIMENTS

In the $REBa_2Cu_3O_y$ bulk oxide according to the invention, at least one rare earth element selected from the group consisting of La, Nd, Sm, Eu, Gd, Dy, Ho, Y, Er and Yb is advantageously adapted as RE because these elements exhibit high critical temperature and critical current density in the synthesis under an appropriate oxygen partial pressure.

Moreover, when silver is filled in the holes formed in the bulk body as mentioned later, it is required to select an element having a melting point higher than that of silver from the above elements.

When the holes are formed in the bulk oxide, it is effective to form the holes in a direction intersecting with the a-b plane of the 123 type crystal. Because, oxygen diffuses along the a-b plane of the 123 type crystal, so that the diffusion efficiency can be more improved by forming the holes in the direction intersecting with the a-b plane of the 123 type crystal.

Figure 1:
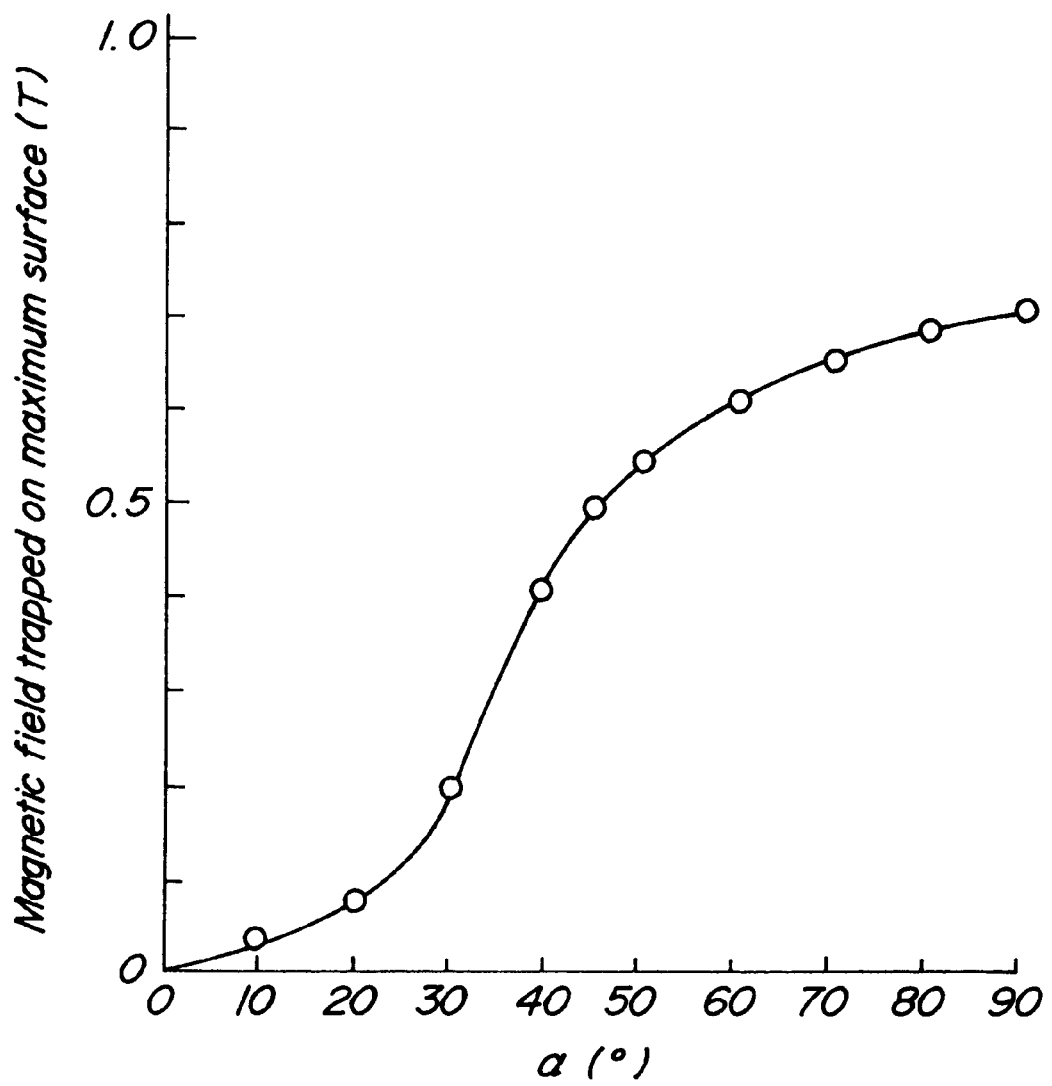
FIG. 1 is a graph showing the influence of an angle α between the hole forming direction and the a-b plane.

When holes having a diameter of 1 mm are formed in a Y123 superconductor having a diameter of 45 mm and a thickness of 15 mm at intervals of 5 mm, the influence of an angle α between the hole forming direction and the a-b plane upon diffusion efficiency of oxygen is shown in FIG. 1 by maximum magnetic field trapped on the surface when magnetic field is applied to the superconductor after the oxygen annealing.

As shown in FIG. 1, when the interval between the holes is constant, as the angle α becomes small, the oxygen diffusion efficiency is substantially lowered.

In order to obtain good diffusion efficiency, the angle α is 45–90°, preferably 60–90°.

The size of the hole is favorable to be about 0.01–2.0 mm as a diameter. When the diameter exceeds 2.0 mm, the ratio of the superconductor occupied in a whole of the bulk body decreases to deteriorate the bulk superconducting property, while when it is less than 0.1 mm, the formation of the hole is practically difficult.

Further, the volume ratio of the holes in the bulk oxide is favorable to be 0.1–20%. When the volume ratio is less than 0.1%, the diffusion of oxygen into the inside of the bulk body takes a long time, while when it exceeds 20%, the ratio of the superconductor decreases to deteriorate the bulk superconducting property.

In the invention, it is important that the holes are equally formed in the bulk oxide. For example, when the holes have a diameter of 1 mm, it is favorable that the holes are equally arranged at an interval between adjoining holes of about 5–20 mm (i.e. volume ratio: 0.1–3%).

Since the effect is unchangeable irrespectively of the shape of the hole such as a through-hole or the like, it is important to form the holes of an appropriate size at an appropriate volume ratio.

And also, the atmosphere in the oxygen annealing is optimum to be pure oxygen atmosphere, but there is caused substantially no difference in the effect when the oxygen concentration is at least 80%.

When the holes are formed in the manner as described above, oxygen can effectively be introduced into the inside of the bulk body during the oxygen annealing of the bulk oxide.

In this method, however, there is a tendency to lower the mechanical strength of the bulk body itself and cause cracks by thermal shock or the like. This tendency is more promoted when the cavity or void is created in the bulk body.

The inventors have made further studies and noticed the addition of silver.

That is, oxygen is known to diffuse through silver. In the invention, therefore, the oxygen annealing is carried out after silver is filled into the holes formed in the bulk body. As a result, oxygen is smoothly fed to not only to the surface of the bulk body but also to the inside thereof through the silver. Further, silver is filled in not only into the holes but also into defects in the bulk body such as cavities, voids and cracks, whereby the strength of the bulk body can effectively be improved.

As the method of filling silver, there are favorably used (1) a method wherein silver powder is filled into the holes formed in the bulk oxide, or a silver rod having the same diameter as the hole is inserted into the hole and then heat-treated, and (2) a method wherein silver is fused by heating and the bulk oxide provided with the holes is placed thereon to conduct filling into the holes through capillarity.

The following examples are given in the illustration of the invention and are not intended as limitations thereof.

EXAMPLE 1

Powders of $Y_2O_3$, $BaCO_3$ and CuO are mixed at a ratio of Y:Ba:Cu=1.8:2.4:3.4, which is uniaxially shaped and calcined on an alumina board in an electric furnace in air at 920° C. for 30 hours and pulverized. Then, the pulverized powder is placed in a platinum crucible, and subjected to rapid melting at 1400° C. (in air) for 20 minutes, and thereafter quenched to room temperature with a copper plate. Next, the quenched product is pulverized and shaped into a disc having a diameter of 60 mm and a thickness of 15 mm.

Thereafter, the disc-shaped body is treated in an electric furnace having a temperature gradient in a vertical direction at 1100° C. for 20 minutes to render the body into a partially melted state and a seed crystal of Nd 123 is placed on a center of the disc-shaped body at 1050° C. and cooled to 1010° C., which is then cooled at a cooling rate of 1° C./h to 900° C. and finally furnace-cooled to room temperature.

The thus obtained crystal has a c-axis perpendicular to the radial direction of the disc.

The crystal sample is pierced by means of a drill with holes 1 mm in diameter at intervals of 5 mm in the directions of various angles α as shown in Table 1 with respect to the a-b plane (volume ratio=3%) and subjected to oxygen annealing in a pure oxygen atmosphere at 400° C. for 100 hours to obtain a bulk superconductor.

Two specimens of 2 mm×2 mm×0.5 mm in a direction perpendicular to the c-axis are cut out from an outer peripheral portion and central portion of the resulting bulk superconductor, cooled to 10 K in a non-magnetic field and then a magnetic field of 10 Oe is applied thereto to measure the superconducting transition temperature by means of a superconducting quantum interference magnetometer. And also, critical current density at 77 K and 1 T is measured.

Furthermore, the fracture toughness $K_C$ is measured by means of a Vicker's hardness tester with respect to each of the outer peripheral portion and the central portion of five specimens and the mechanical strength is evaluated from an average of the measured values.

The results are shown in Table 1.

Moreover, results measured on the conventional specimen containing no hole as defined in the invention are also shown in Table 1.

EXAMPLE 2

The holes are formed in the disc-shaped body in the same manner as in Example 1 and thereafter a silver rod having the same size as the hole is inserted into the hole, which is placed in an electric furnace and held at 980° C. in air for 48 hours to fill molten silver into the holes.

Thereafter, the thus treated bulk body is subjected to an oxygen annealing in the same manner as in Example 1 and then various properties are measured.

The thus measured results are also shown in Table 1.

EXAMPLE 3

Powders of $Nd_2O_3$, $Sm_2O_3$, $BaCO_3$ and $CuO$ are mixed at a mixing ratio of Nd:Sm:Ba:Cu=0.9:0.9:2.4:3.4, which is uniaxially shaped and calcined on an alumina board in an electric furnace in air at 880° C. for 30 hours and pulverized. Then, the pulverized powder is shaped and fired at 980° C. in an atmosphere of 1% oxygen-argon gas for 24 hours. Thereafter, the shaped body is pulverized to form a precursor, which is shaped into a disc having a diameter of 60 mm and a thickness of 15 mm.

Thereafter, the disc-shaped body is treated in an electric furnace having a vertical temperature gradient in an atmosphere of 0.1% oxygen-argon gas at 1080° C. for 20 minutes to render into a partially melted state and a seed crystal of $SrLaGaO_4$ is placed on a center of the disc-shaped body at 1050° C. so as to render a growth-starting portion into 1030° C., which is cooled to 900° C. at a cooling rate of 1° C./h and then furnace-cooled to room temperature.

The thus obtained crystal has the c-axis oriented perpendicular to the radial direction of the disc.

The crystal sample is pierced by means of a drill with holes of 1 mm in diameter at intervals of 5 mm in a direction of various angles α as shown in Table 2 with respect to the a-b plane (volume ratio=3%) and subjected to oxygen annealing in a pure oxygen atmosphere at 300° C. for 100 hours to obtain a bulk superconductor.

TABLE 1

| | | Silver filling | Transition temperature (K.) | | $J_c$ (A/cm$^2$) | | $K_c$ (MPam$^{1/2}$) | |
|---|---|---|---|---|---|---|---|---|
| | | | outer peripheral portion | central portion | outer peripheral portion | central portion | outer peripheral portion | central portion |
| Hole-forming angle α | 45° | no filled | 91.0 | 89.0 | 24300 | 13500 | 1.4 | 1.2 |
| | 60° | " | 91.0 | 91.5 | 24400 | 23100 | 1.2 | 1.4 |
| | 75° | " | 92.0 | 91.5 | 30200 | 27500 | 1.3 | 1.3 |
| | 90° | " | 92.0 | 92.0 | 31500 | 30700 | 1.3 | 1.2 |
| Conventional bulk body containing no hole | | — | 92.0 | 85.0 | 21000 | 2000 | 1.3 | 1.4 |
| Hole-forming angle α | 45° | filled | 90.5 | 89.5 | 22000 | 20100 | 1.9 | 1.8 |
| | 60° | " | 92.0 | 91.5 | 31000 | 27000 | 2.0 | 1.9 |
| | 75° | " | 92.0 | 92.0 | 32000 | 28500 | 2.0 | 2.0 |
| | 90° | " | 92.0 | 92.0 | 33000 | 29000 | 2.2 | 2.0 |

As seen from Table 1, the bulk oxides containing holes according to the invention are high in the superconducting transition temperature and large in the critical current density and excellent in the superconducting property as compared with the conventional bulk body containing no hole.

Particularly, when silver is filled in the holes, the mechanical strength is largely improved as compared with the conventional bulk body, which is considered due to the fact that not only the holes but also the cavities or voids in the bulk body are effectively filled with silver.

Figure 2:
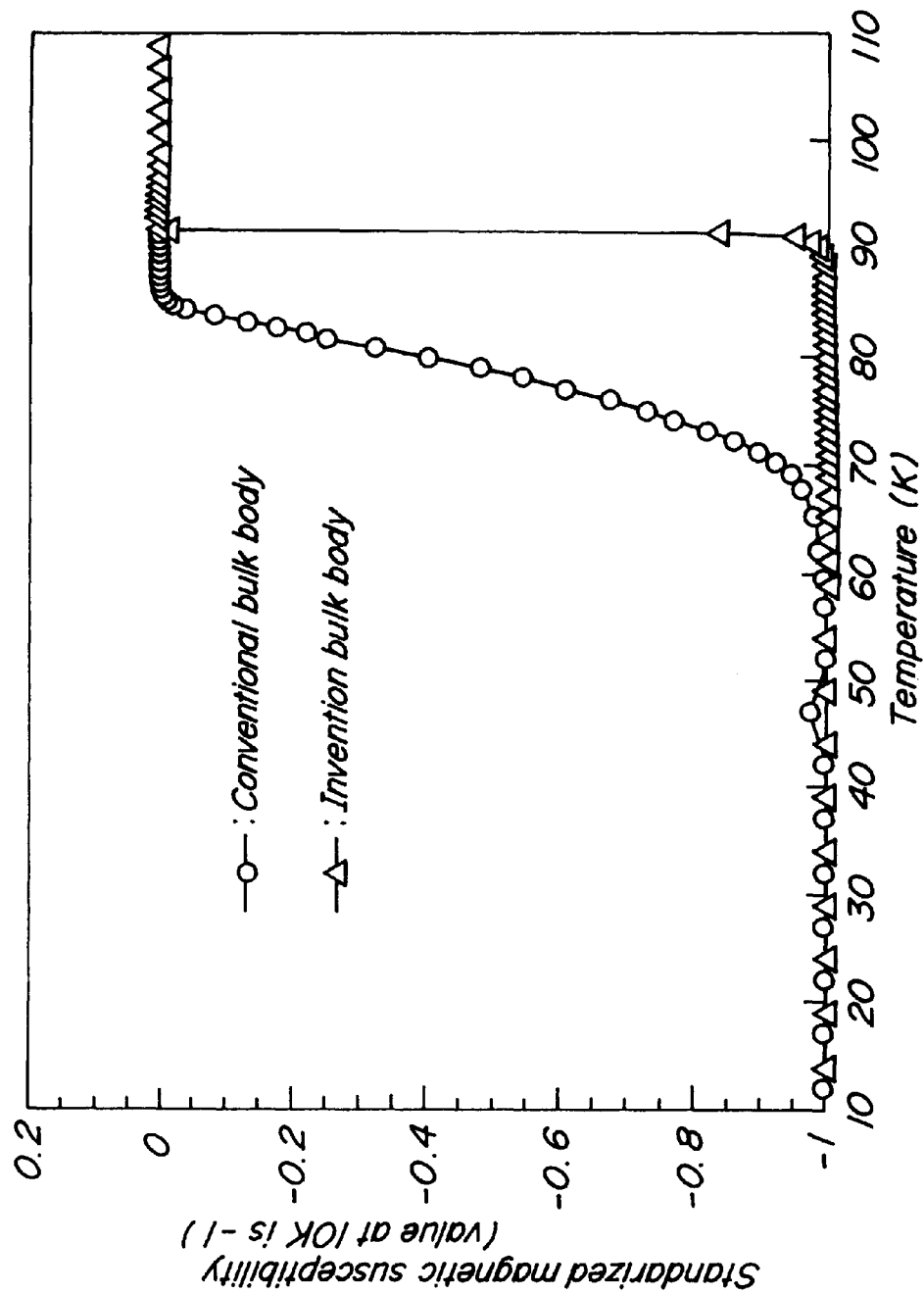
FIG. 2 is a graph showing a superconducting transition curve of a sample cut out from a central portion of each of the bulk body containing holes filled with silver according to the invention and a conventional bulk body containing no hole.

FIG. 2 shows results examined on the superconducting transition curve with respect to specimens cut out from central portions of silver filled body of Example 2 (the hole forming direction is perpendicular to the a-b plane) and the conventional bulk body containing no hole. As seen from FIG. 2, the superconducting transition curve of the conventional bulk body is fairly broad, which indicates that oxygen is not sufficiently introduced into the bulk body.

A part of the specimen is subjected to silver filling in an electric furnace at 980° C. in air for 48 hours by using a silver rod having the same size as the hole diameter.

Two specimens of 2 mm×2 mm×0.5 mm in a direction perpendicular to the c-axis are cut out from an outer peripheral portion and central portion of the thus obtained bulk superconductors and then the superconducting transition temperature, critical current density at 77 K and 2 T and fracture toughness $K_C$ are measured in the same manner as in Example 1.

The results are shown in Table 2.

TABLE 2

| | | Silver filling | Transition temperature (K.) | | $J_c$ (A/cm$^2$) | | $K_c$ (MPam$^{1/2}$) | |
|---|---|---|---|---|---|---|---|---|
| | | | outer peripheral portion | central portion | outer peripheral portion | central portion | outer peripheral portion | central portion |
| Hole-forming angle α | 45° | no filled | 94.0 | 89.5 | 20500 | 11500 | 1.0 | 1.2 |
| | 60° | " | 94.0 | 92.0 | 18300 | 17100 | 1.2 | 1.3 |
| | 75° | " | 95.0 | 94.0 | 25000 | 19100 | 1.0 | 1.2 |
| | 90° | " | 95.0 | 94.5 | 25500 | 24200 | 1.1 | 1.1 |
| Conventional bulk body containing no hole | | — | 95.0 | 86.5 | 22500 | 3600 | 1.1 | 1.2 |
| Hole-forming angle α | 45° | filled | 94.5 | 92.0 | 18700 | 16500 | 1.9 | 1.8 |
| | 60° | " | 95.0 | 94.0 | 22400 | 19600 | 2.0 | 1.9 |
| | 75° | " | 94.5 | 95.0 | 21500 | 21200 | 1.9 | 1.8 |
| | 90° | " | 94.0 | 95.0 | 25000 | 23000 | 2.0 | 1.9 |

EXAMPLE 4

A bulk superconductor is prepared in the same manner as in Example 3 by using various RE elements shown in Table 3 at a mixing ratio of RE:Ba:Cu=1.8:2.4:3.4. In this case, the hole forming direction is 90° with respect to the a-b plane.

The superconducting transition temperature, critical current density at 77 K and 2 T and fracture toughness are measured and the results are summarized in Table 3.

According to the invention, sufficient quantity of oxygen can quickly and uniformly be introduced into the bulk oxide by forming holes in the bulk oxide, whereby the superconducting property of a large-size bulk body can considerably be improved.

Further, the mechanical strength of the bulk body can effectively be improved without obstructing the oxygen annealing by filling silver into the holes formed in the bulk oxide body.

TABLE 3(a)

| Run No. | Kind of RE | Presence or absence of hole | Silver filling | Transition temperature (K.) | | $J_c$ (A/cm$^2$) | | $K_c$ (MPam$^{1/2}$) | |
|---|---|---|---|---|---|---|---|---|---|
| | | | | outer peripheral portion | central portion | outer peripheral portion | central portion | outer peripheral portion | central portion |
| 1 | La | presence | no filled | 94.0 | 93.0 | 9500 | 8900 | 1.2 | 1.3 |
| 2 | | | filled | 93.0 | 93.0 | 9500 | 9200 | 1.7 | 1.5 |
| 3 | | absence | — | 94.0 | 86.0 | 9300 | 2500 | 1.2 | 1.2 |
| 4 | Nd | presence | no filled | 96.0 | 96.0 | 24000 | 20500 | 1.1 | 1.0 |
| 5 | | | filled | 95.0 | 95.5 | 23500 | 24200 | 1.8 | 1.9 |
| 6 | | absence | — | 96.0 | 87.5 | 22500 | 3100 | 1.1 | 1.2 |
| 7 | Sm | presence | no filled | 95.0 | 94.5 | 21000 | 19500 | 1.2 | 1.3 |
| 8 | | | filled | 95.0 | 95.0 | 22500 | 20700 | 1.7 | 1.7 |
| 9 | | absence | — | 95.0 | 86.0 | 23000 | 2500 | 1.2 | 1.3 |
| 10 | Eu | presence | no filled | 94.0 | 92.5 | 17200 | 15200 | 1.1 | 1.0 |
| 11 | | | filled | 93.5 | 94.0 | 16500 | 17300 | 1.8 | 1.6 |
| 12 | | absence | — | 94.0 | 82.5 | 17000 | 1400 | 1.0 | 1.0 |
| 13 | Gd | presence | no filled | 93.0 | 92.0 | 17100 | 15900 | 1.2 | 1.3 |
| 14 | | | filled | 93.0 | 92.5 | 16200 | 14900 | 1.9 | 1.8 |
| 15 | | absence | — | 93.0 | 82.5 | 16700 | 1100 | 1.2 | 1.1 |
| 16 | Dy | presence | no filled | 92.0 | 91.5 | 12000 | 10000 | 1.2 | 1.1 |
| 17 | | | filled | 91.5 | 92.0 | 10500 | 11700 | 1.9 | 2.0 |
| 18 | | absence | — | 92.0 | 80.5 | 11700 | 900 | 1.2 | 1.1 |
| 19 | Ho | presence | no filled | 92.0 | 91.5 | 10700 | 9700 | 1.0 | 1.3 |
| 20 | | | filled | 92.0 | 91.5 | 10200 | 10000 | 1.9 | 2.1 |
| 21 | | absence | — | 92.0 | 82.0 | 10000 | 1000 | 1.0 | 1.2 |
| 22 | Er | presence | no filled | 92.0 | 90.5 | 8000 | 6600 | 1.3 | 1.1 |
| 23 | | | filled | 91.0 | 91.5 | 8300 | 8700 | 2.1 | 2.0 |
| 24 | | absence | — | 92.0 | 82.0 | 8400 | 1300 | 1.3 | 1.1 |
| 25 | Yb | presence | no filled | 91.5 | 90.5 | 6200 | 6100 | 1.4 | 1.2 |
| 26 | | | filled | 91.5 | 90.0 | 6000 | 5900 | 2.0 | 2.0 |
| 27 | | absence | — | 91.5 | 80.5 | 5900 | 750 | 1.2 | 1.3 |
| 28 | Nd: 70 | presence | no filled | 94.0 | 93.0 | 19500 | 16500 | 1.0 | 0.9 |
| 29 | Eu: 30 | | filled | 93.0 | 92.5 | 18000 | 15000 | 1.8 | 1.7 |
| 30 | | absence | — | 94.0 | 85.5 | 19200 | 2300 | 1.1 | 1.2 |
| 31 | Sm: 60 | presence | no filled | 94.0 | 94.0 | 14500 | 13000 | 1.2 | 1.2 |
| 32 | Gd: 40 | | filled | 94.0 | 93.0 | 13900 | 12900 | 2.0 | 2.1 |
| 33 | | absence | — | 94.0 | 86.5 | 14100 | 2100 | 1.0 | 1.3 |

What is claimed is:

1. A process for producing a bulk superconductor body comprising the steps of:

providing a melt-grown $REBa_2Cu_3O_y$ body precursor, wherein RE is a rare earth metal and y is the oxygen content, said oxygen content having a value of about 6.1 to 6.4 at least on the inside of the body;

forming a plurality of holes in the body to increase its surface area; and conducting oxygen annealing of said body such that oxygen is diffused into the body at least through said holes and the value of y is increased to about 6.9 thus making said body superconductive.

2. A process according to claim 1, wherein RE is at least one rare earth element selected from the group consisting of La, Nd, Sm, Eu, Gd, Dy, Ho, Y, Er and Yb.

3. A process according to claim 1, wherein said body has a 123 form of crystal with an a-b plane, and wherein said holes are formed in a direction intersecting said a-b plane of said crystal.

4. A process according to claim 3, wherein the angle of said intersection with said a-b plane is 45–90°.

5. A process according to claim 3 wherein the angle of said intersection with said a-b plane is 60–90°.

6. A process according to claim 1, wherein said holes have a diameter of 0.01–2.0 mm.

7. A process according to claim 1, wherein the volume ratio of said holes in said bulk oxide crystal body is 0.1–20%.

8. A process according to claim 1, wherein said oxygen annealing is carried out after silver is filled into said holes.

9. A process according to claim 1 wherein said holes are uniformly arranged at a spacing of 5–20 mm.

10. The process defined in claim 1 wherein said holes extend inside said bulk oxide crystal body and wherein said oxygen annealing is conducted within said holes to increase the value of y within said body.

* * * * *